United States Patent
Chiang et al.

(10) Patent No.: US 6,818,538 B2
(45) Date of Patent: Nov. 16, 2004

(54) BALL GRID ARRAY SEMICONDUCTOR PACKAGE AND METHOD OF FABRICATING THE SAME

(75) Inventors: Kuo-Chu Chiang, Taichung (TW); Yu-Ting Lai, Taichung (TW); Chin Te Chen, Taichung (TW)

(73) Assignee: Siliconware Precision Industries Co., Ltd. (TW)

( * ) Notice: Subject to any disclaimer, the term of this patent is extended or adjusted under 35 U.S.C. 154(b) by 0 days.

(21) Appl. No.: 10/418,838

(22) Filed: Apr. 18, 2003

(65) Prior Publication Data

US 2004/0169273 A1 Sep. 2, 2004

(30) Foreign Application Priority Data

Feb. 27, 2003 (TW) ...................................... 92104148 U (51) Int. Cl.[7] ................................................ H01L 21/44
(52) U.S. Cl. .................... 438/611; 438/613; 438/618; 257/735; 257/778
(58) Field of Search .................................. 438/118, 125, 438/122, 107, 110; 257/734, 777, 680

(56) References Cited

U.S. PATENT DOCUMENTS 6,650,019 B2 * 11/2003 Glenn et al. ................. 257/777

* cited by examiner

*Primary Examiner*—Long Pham
*Assistant Examiner*—(Vikki) Hoa B. Trinh
(74) *Attorney, Agent, or Firm*—Peter F. Corless; Steven M. Jensen; Edwards & Angell, LLP (57) ABSTRACT

A ball grid array semiconductor packaging technology is provided, which is characterized in that openings of a solder mask are formed on a given edge of a die attachment area, and entire or partial width of each opening is disposed outside the die attachment area. Accordingly, air within the opening of the solder mask is sufficiently eliminated during die bonding process, so as to prevent void formation as adhesive is filled into the opening. Therefore, in the follow-up steps, high temperature in reflowing process will not cause popcorn as in the prior-art, so as to remain good quality of the semiconductor package.

10 Claims, 8 Drawing Sheets

BALL GRID ARRAY SEMICONDUCTOR PACKAGE AND METHOD OF FABRICATING THE SAME

BACKGROUND OF THE INVENTION

1. Field of the Invention

This invention relates to semiconductor packaging technology, and more particularly, to a ball grid array (BGA) semiconductor package and method of fabricating the same, which can be used for the fabrication of a BGA package, and which can help prevent the fabricated BGA package from having voids in the package body thereof to thereby ensure the quality of the BGA package.

2. Description of Related Art

BGA (Ball Grid Array) is an advanced type of semiconductor packaging technology which is characterized by the use of a substrate as chip carrier whose front side is used for mounting one or more semiconductor chips and whose back side is provided with a grid array of solder balls. During SMT (Surface Mount Technology) process, the BGA package can be mechanically bonded and electrically coupled to an external printed circuit board (PCB) by means of these solder balls.

Figure 1A:
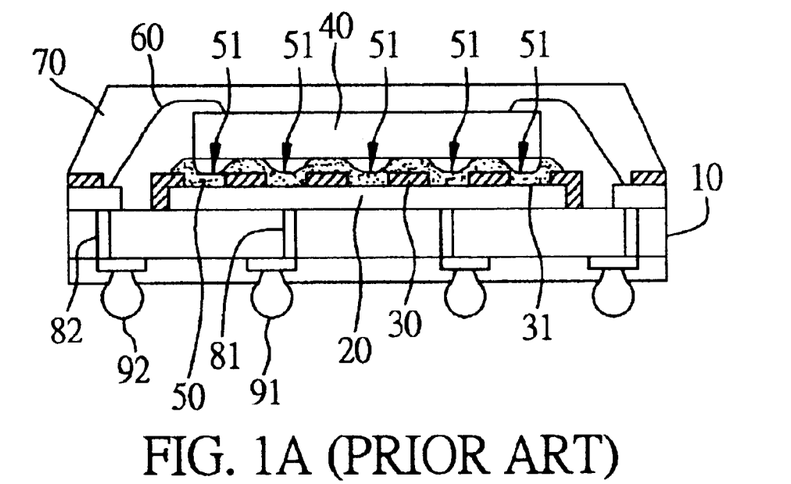
FIG. 1A (PRIOR ART) is a schematic diagram showing a sectional view of a conventional BGA package.
Figure 1B:
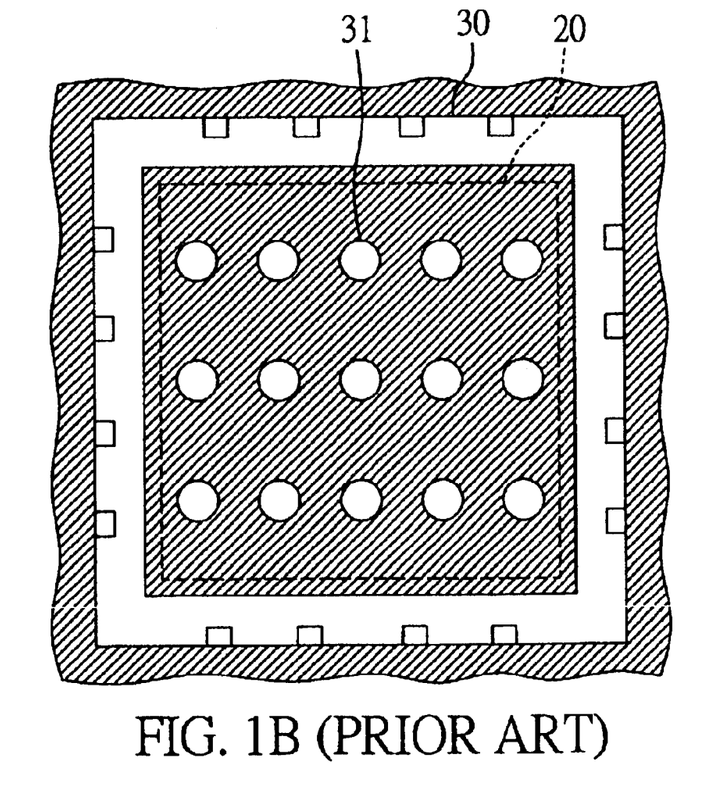
FIG. 1B (PRIOR ART) is a schematic diagram showing a top view of the conventional BGA package of FIG. 1A.

FIG. 1A and FIG. 1B respectively show a sectional view and a top view of a conventional BGA package. As shown, this BGA package comprises: (a) a substrate 10; (b) a ground pad 20; (c) a solder mask 30; (d) a semiconductor chip 40; (e) an electrically-conductive layer (such as silver paste) 50; (f) a set of bonding wires (such as gold wires) 60; (g) an encapsulation body 70; (h) a plurality of electrically-conductive vias, including a group of ground/heat-dissipation vias 81 and a group of power/signal vias 82; and (i) a grid array of solder balls, including a group of ground/heat-dissipation balls 91 and a group of power/signal vias 92.

The chip 40 is electrically coupled to the ground/heat-dissipation balls 91 successively by way of the silver paste layer 50, the ground pad 20, and the ground/heat-dissipation vias 81, so as to be electrically coupled to the ground/heat-dissipation structure on an external printed circuit board (not shown) by way of the ground/heat-dissipation vias 81.

One drawback to the foregoing BGA package, however, is that voids 51 would exist in the silver paste layer 50 filled in the opening 31 of the solder mask 30, which would undesirably cause a popcorn effect during subsequent reflow process under a high temperature condition. This popcorn effect would break apart the encapsulation body, causing the BGA package to become defective.

Figure 2A:
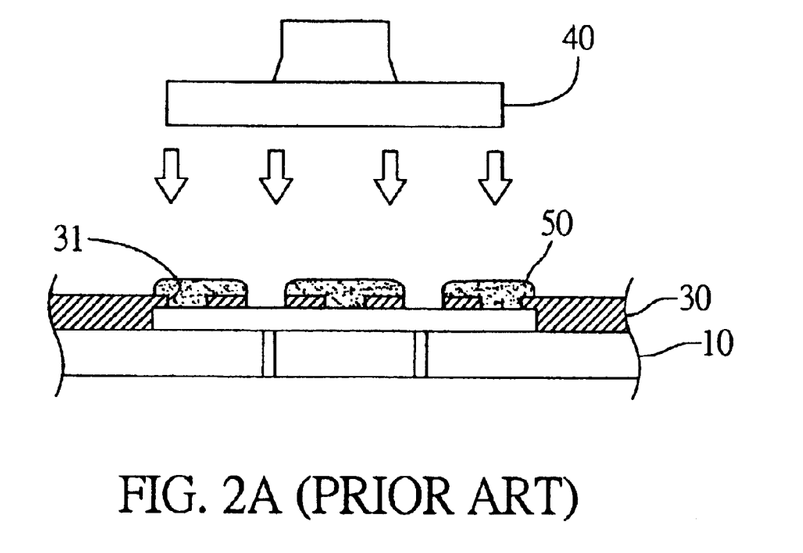
FIGS. 2A–2C are flow diagrams used to depict the procedural steps involved a die-attachment process in a conventional method for fabricating a BGA package.
Figure 2B:
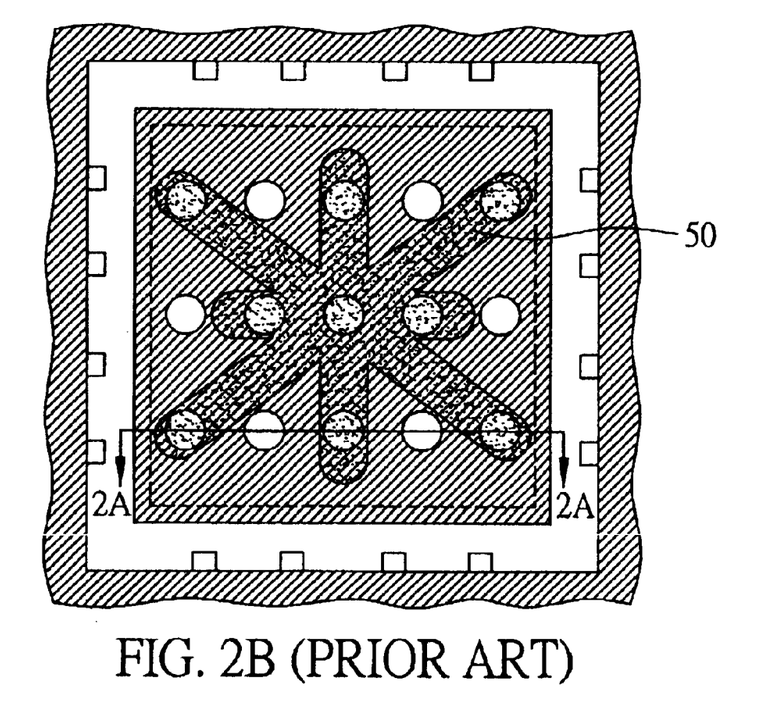
Figure 2C:
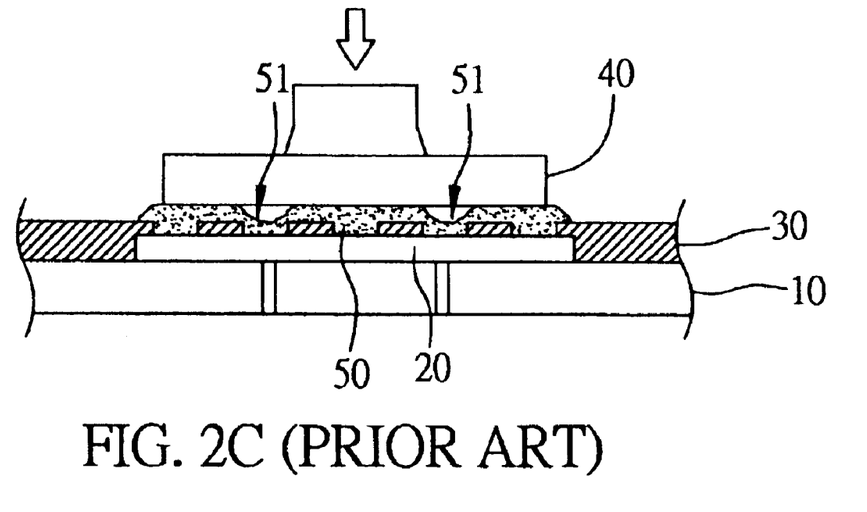

The cause of the existence of the voids 51 is depicted in FIGS. 2A–2C. As shown in FIG. 2A, during the die-attachment process, an adhesive agent, such as silver paste, is coated over the surface of the solder mask 30 to form the silver paste layer 50; and then as shown in FIG. 2B and FIG. 2C, the chip 40 is forcefully pressed down against the silver paste layer 50, thus urging the silver paste layer 50 to spread out over the die-attachment area. During this process, however, since the overall width of the chip 40 is located directly above the opening 31 in the solder mask 30, it would undesirably trap the air in the opening 31, thus resulting in the forming of voids 51 therein. The existence of these voids 51 would undesirably cause a popcorn effect during subsequent reflow process under a high temperature condition. This popcorn effect would break apart the encapsulation body, causing the BGA package to become defective.

Related patents includes, for example, the following patents:

U.S. Pat. No. 5,545,923 "SEMICONDUCTOR DEVICE ASSEMBLY WITH MINIMIZED BOND FINGER CONNECTIONS";

U.S. Pat. No. 5,703,402 "OUTPUT MAPPING OF DIE PAD BONDS IN A BALL GRID ARRAY".

The foregoing patents, however, provide no solutions to the aforementioned problem, and therefore it cannot be used to eliminate the popcorn effect to help ensure the quality of the BGA package. There exists therefore a need in the semiconductor industry for a new semiconductor packaging technology that can eliminate the popcorn effect due to existence of voids in the BGA package.

SUMMARY OF THE INVENTION

It is therefore an objective of this invention to provide a new BGA semiconductor packaging technology that can eliminate the popcorn effect due to existence of voids in the BGA package.

The BGA semiconductor packaging technology according to the invention comprises the following steps: preparing a substrate having a predefined die-attachment area on one surface thereof; (2) forming a ground pad over the die-attachment area on the substrate; (3) forming a solder mask over the ground pad, wherein the solder mask is formed with at least one opening to expose one portion of the ground pad, and wherein the opening is located in such a manner that a fraction of the overall width of the opening is located beyond the die-attachment area; (4) pasting an adhesive agent over the solder mask; and (5) pressing at least one semiconductor chip forcefully against the adhesive agent over the solder mask, causing the adhesive agent over the solder mask to spread out sideways and fill into the opening in the solder mask to expel the air in the opening through the gap above the opening to the atmosphere.

The BGA semiconductor packaging technology according to the invention is characterized in that openings of a solder mask are formed on a given edge of a die attachment area, and entire or partial width of each opening is disposed outside the die attachment area. Accordingly, air within the opening of the solder mask is sufficiently eliminated during die bonding process, so as to prevent void formation as adhesive is filled into the opening. Therefore, in the follow-up steps, high temperature in reflowing process will not cause popcorn as in the prior-art, so as to remain good quality of the semiconductor package.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENTS

Various preferred embodiments of the BGA semiconductor packaging technology according to the invention are disclosed in fill details in the following with reference to FIGS. 3A–3E through FIG. 6.

First Preferred Embodiment

Figure 3A:
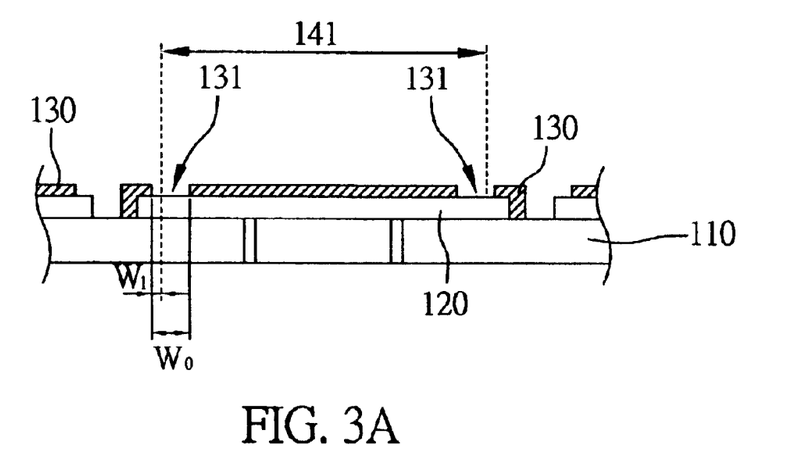
FIGS. 3A–3E are flow diagrams used to depict a die-attachment process in a first preferred embodiment of the method according to the invention for fabricating a BGA package.
Figure 3B:
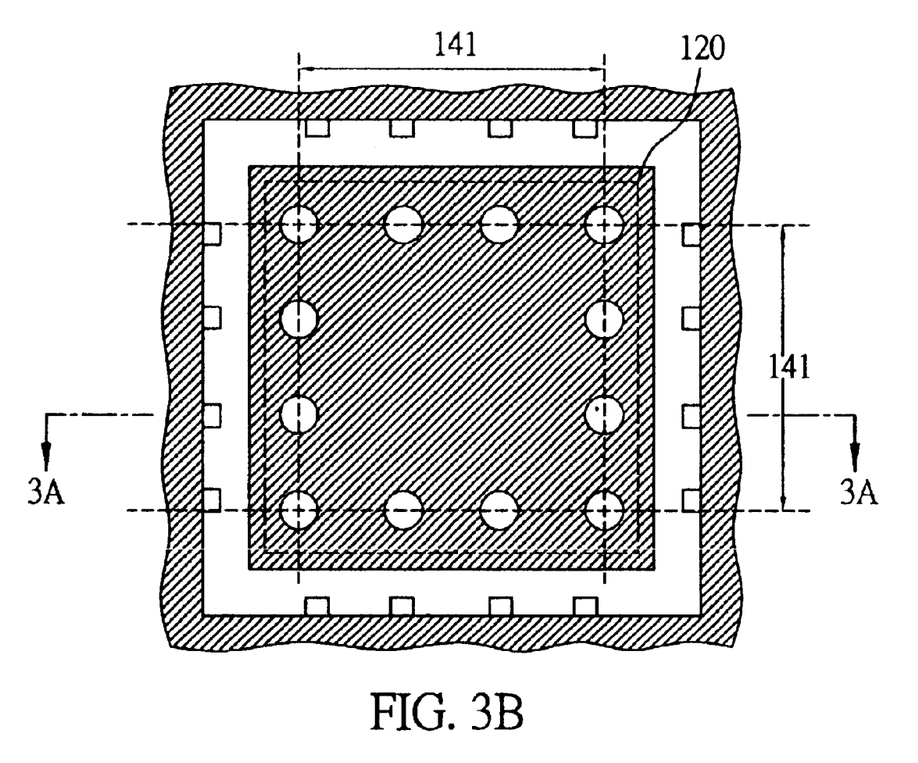

Referring to FIG. 3A and FIG. 3B (where FIG. 3A shows a sectional view while FIG. 3B shows a top view), the first step of a fabrication process according to the method of the invention is to prepare a substrate 10 which is formed with a ground pad 120 and a solder mask 130 thereon. Since the fabrication methods of this ground pad 120 and the solder mask 130 are both conventional technologies, detailed description thereof will not be given here in this specification.

Next, a plurality of openings 131 are formed in the solder mask 130 to expose portions of the ground pad 120 under the solder mask 130. The invention is characterized in that these openings 131 are located on the rims of predefined die-attachment area 141, allowing each opening 131 to have a predefined width $W_1$ left beyond the die-attachment area 141, where the predefined width $W_1$ can be, for example, ½ or ⅓ of the overall width $W_0$ of each opening 131.

Figure 3C:
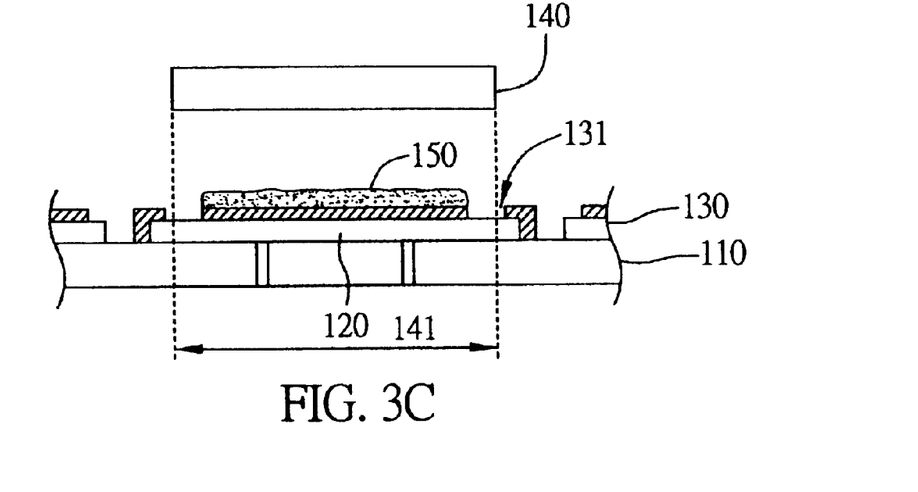
Figure 3D:
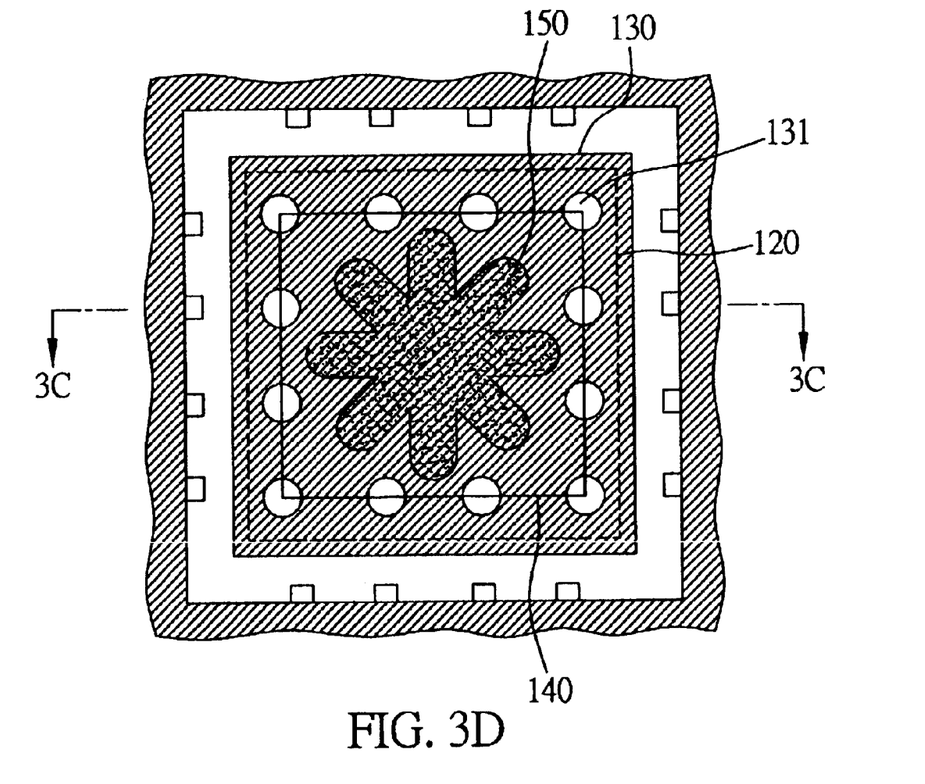
Figure 3E:
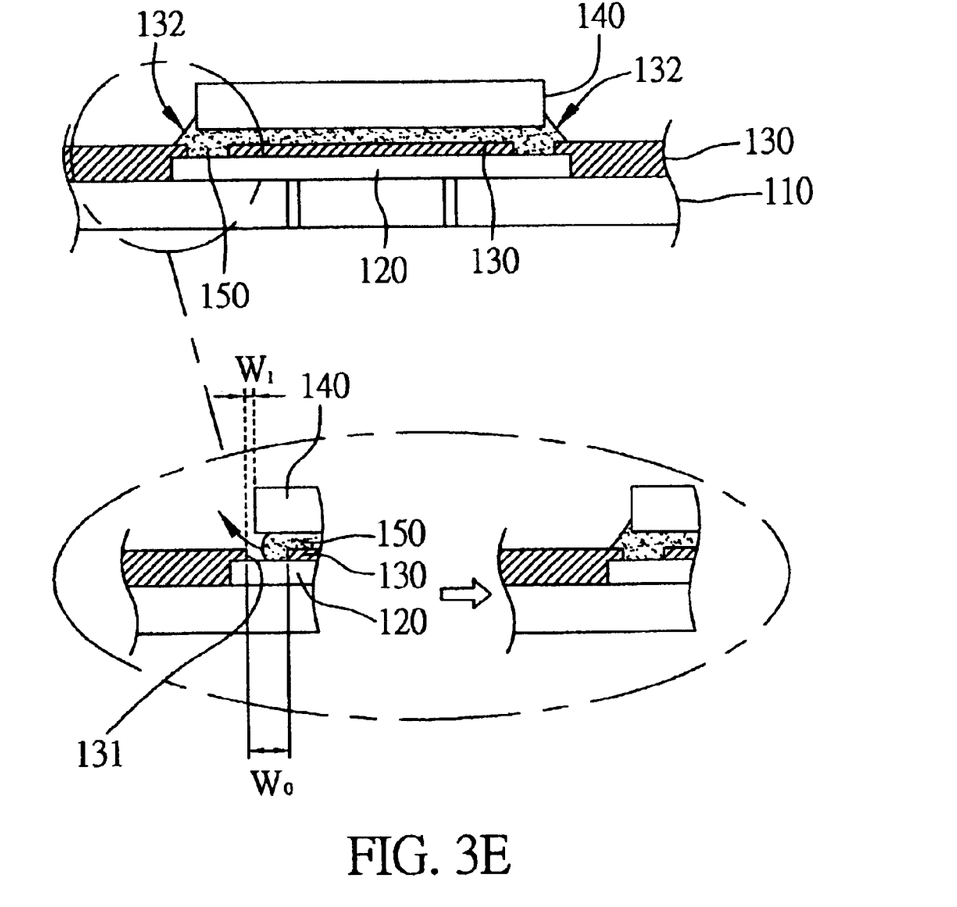

Referring next to FIG. 3C and FIG. 3D (where FIG. 3C shows a sectional view while FIG. 3D shows a top view), in the subsequent step, an electrically-conductive paste, such as silver paste 150, is coated over the entire surface of the solder mask 130; and then a semiconductor chip 140 is attached onto the die-attachment area 141 and pressed forcefully against the silver paste 150, causing the silver paste 150 to spread out sideways and fill into the openings 131 in the solder mask 130. During this process, as illustrated in FIG. 3E, since the chip 140 covers only a fraction of the overall width $W_0$ of each opening 131 in the solder mask 130 (i.e., the width W1 left beyond the die-attachment area 141 would now form a gap 132, allowing the air in the openings 131 of the solder mask 130 to escape through this gap 132 to the atmosphere. Consequently, those portions of the silver paste 150 that are filled into the openings 131 would be substantially free of voids.

Subsequent processes to finish the BGA package include wire bonding, encapsulation, ball implantation, and reflow, but since all of those processes utilize conventional technologies, detailed description thereof will not be given here in this specification.

Figure 4:
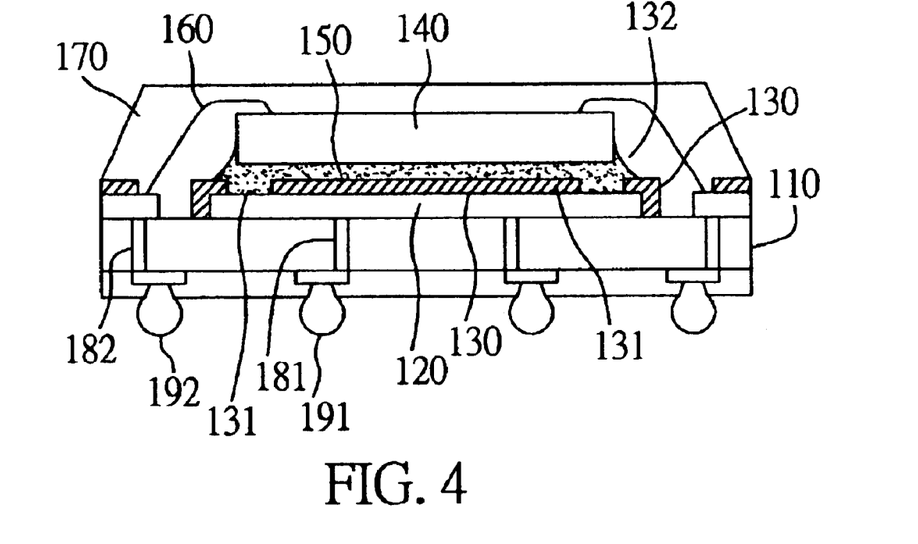
FIG. 4 is a schematic diagram showing a sectional view of the first preferred embodiment of the BGA package.

FIG. 4 shows the structure of the BGA package fabricated by the method according to the invention. As shown, this BGA package comprises: (a) a substrate 110; (b) a ground pad 120; (c) a solder mask 130 having a plurality of openings 131 exposing portions of the ground pad 120; (d) a semiconductor chip 140; (e) an electrically-conductive layer (such as silver paste) 150; (f) a set of bonding wires (such as gold wires) 160; (g) an encapsulation body 170; (h) a plurality of electrically-conductive vias, including a group of ground/heat-dissipation vias 181 and a group of power/signal vias 182; and (i) a grid array of solder balls, including a group of ground/heat-dissipation balls 191 and a group of power/signal vias 192.

Since the BGA package fabricated according to the invention can prevent the openings 131 in the solder mask 130 over the ground pad 120 from having voids during die-attachment process, it would not suffer from popcorn effect as in the case of the prior art, thus ensuring the quality of the fabricated BGA package.

Second Preferred Embodiment

Figure 5A:
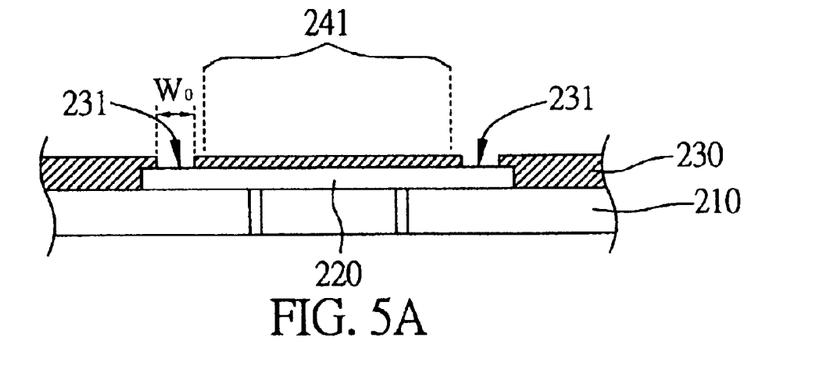
FIGS. 5A–5C are flow diagrams used to depict a die-attachment process in a second preferred embodiment of the method according to the invention for fabricating a BGA package.
Figure 5B:
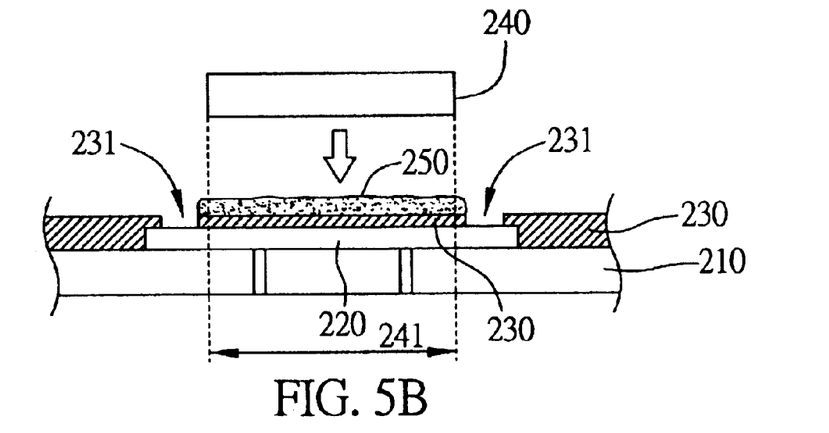
Figure 5C:
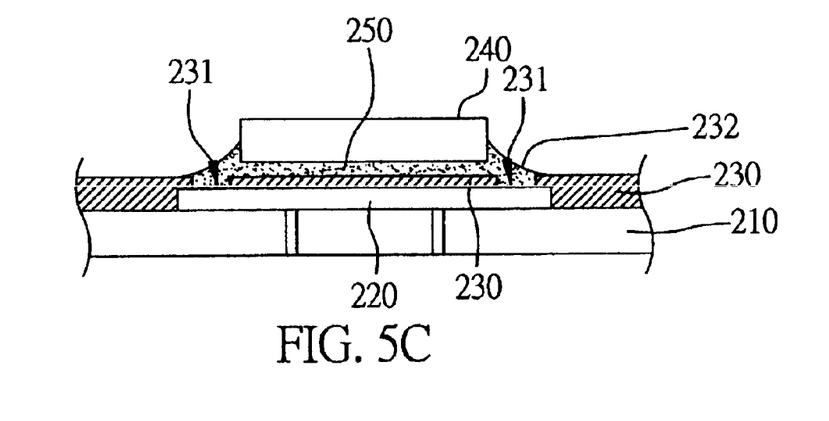

FIGS. 5A–5C are schematic diagrams used to depict a second preferred embodiment of the semiconductor packaging technology according to the invention. As shown in FIG. 5A, the first step of the second preferred embodiment of the method according to the invention is to prepare a substrate 210 which is formed with a ground pad 220 and a solder mask 230 thereon; and subsequently, a plurality of openings 231 are formed in the solder mask 230 to expose portions of the ground pad 220 under the solder mask 230. This embodiment differs from the previous one particularly in that the overall width of each opening 231 is located beyond the die-attachment area 241.

Referring next to FIG. 5B, in the subsequent step, an electrically-conductive paste, such as silver paste 250, is coated over the entire surface of the solder mask 230; and then, as illustrated in FIG. 5C, a semiconductor chip 240 is attached onto the die-attachment area 241 and pressed forcefully against the silver paste 250, causing the silver paste 250 to spread out sideways and fill into the openings 231 in the solder mask 230. During this process, since the chip 240 leaves the openings 231 in the solder mask 230 entirely uncovered, the air in the openings 231 of the solder mask 230 can freely escape through this gap 232 to the atmosphere without any hindrance. Consequently, those portions of the silver paste 250 that are filled into the openings 231 would be substantially free of voids.

Figure 6:
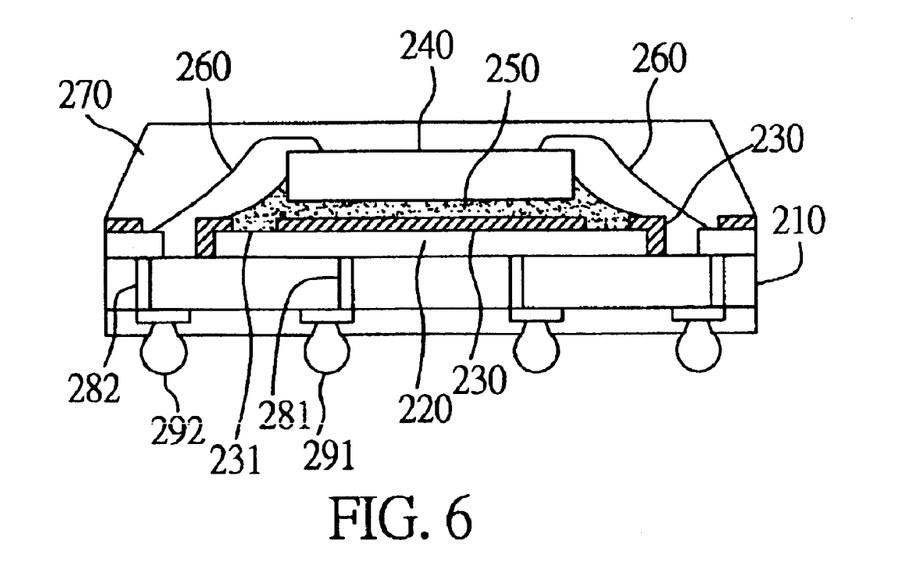
FIG. 6 is a schematic diagram showing a sectional view of the second preferred embodiment of the BGA package.

FIG. 6 shows the structure of the BGA package fabricated by the second preferred embodiment of the method according to the invention. As shown, this BGA package comprises: (a) a substrate 210; (b) a ground pad 220; (c) a solder mask 230 having a plurality of openings 231 exposing portions of the ground pad 220; (d) a semiconductor chip 240; (e) an electrically-conductive layer (such as silver paste) 250; (f) a set of bonding wires (such as gold wires) 260; (g) an encapsulation body 270; (h) a plurality of electrically-conductive vias, including a group of ground/heat-dissipation vias 281 and a group of power/signal vias 282; and (i) a grid array of solder balls, including a group of ground/heat-dissipation balls 291 and a group of power/signal vias 292.

By the second preferred embodiment, since the openings 231 in the solder mask 230 are entirely located beyond the die-attachment area 241, the air in the openings 231 of the solder mask 230 can freely escape through this gap 232 to the atmosphere without any hindrance; and therefore, the invention can prevent the openings 231 in the solder mask 230 over the ground pad 220 from having voids during die-attachment process, it would not suffer from popcorn effect under high-temperature condition, thus ensuring the quality of the fabricated BGA package.

In conclusion, the invention provides a new BGA semiconductor packaging technology, which is characterized in that openings of a solder mask are formed on a given edge of a die attachment area, and entire or partial width of each opening is disposed outside the die attachment area. Accordingly, air within the opening of the solder mask is sufficiently eliminated during die bonding process, so as to prevent void formation as adhesive is filled into the opening. Therefore, in the follow-up steps, high temperature in reflowing process will not cause popcorn as in the prior-art, so as to remain good quality of the semiconductor package.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A BGA fabrication method, comprising the steps of:
   (1) preparing a substrate having a predefined die-attachment area on one surface thereof;
   (2) forming a ground pad over the die-attachment area on the substrate;
   (3) forming a solder mask over the ground pad, wherein the solder mask is formed with at least one opening to expose one portion of the ground pad, and wherein the opening is located on a rim of the die-attachment area, such that the opening has at least a fraction of its overall width beyond the die-attachment area;
   (4) pasting an adhesive agent over the solder mask; and
   (5) pressing at least one semiconductor chip forcefully against the adhesive agent over the solder mask, causing the adhesive agent over the solder mask to spread out sideways and fill into the opening in the solder mask to expel the air in the opening through the gap above the opening to the atmosphere.

2. The method of claim 1, wherein in said step (3), the fraction of the overall width of the opening located beyond the die-attachment area is from ⅓ to ½ of the overall width of the opening.

3. The method of claim 1, wherein in said step (3), the overall width of the opening is entirely located beyond the die-attachment area.

4. The method of claim 1, wherein in said step (4), the adhesive agent is an electrically-conductive adhesive agent.

5. The method of claim 4, wherein the electrically-conductive adhesive agent is silver paste.

6. A BGA package, which comprises:
   a substrate having a predefined die-attachment area on one surface thereof;
   a ground pad over the die-attachment area on the substrate;
   a solder mask over the ground pad, where the solder mask is formed with at least one opening to expose one portion of the ground pad, and the opening is located on a rim of the die-attachment area, such that the opening has at least a fraction of its overall width beyond the die-attachment area;
   an adhesive agent over the solder mask; and
   at least one semiconductor chip which is mounted over the solder mask by means of the adhesive agent, with the adhesive agent filled in the opening in the solder mask substantially free of voids due to air being expelled to atmosphere through a gap formed by the fraction of the overall width of the opening beyond the die-attachment area.

7. The BGA package of claim 6, wherein the fraction of the overall width of the opening located beyond the die-attachment area is from ⅓ to ½ of the overall width of the opening.

8. The BGA package of claim 6, wherein the overall width of the opening is entirely located beyond the die-attachment area.

9. The BGA package of claim 6, wherein the adhesive agent is an electrically-conductive adhesive agent.

10. The BGA package of claim 9, wherein the electrically-conductive adhesive agent is silver paste.

* * * * *